(12) United States Patent
Kajiyama et al.

(10) Patent No.: US 7,625,810 B2
(45) Date of Patent: Dec. 1, 2009

(54) WAFER PROCESSING METHOD

(75) Inventors: Keiichi Kajiyama, Tokyo (JP); Koichi Kondo, Tokyo (JP); Yasuomi Kaneuchi, Tokyo (JP)

(73) Assignee: Disco Corporation, Tokyo (JP)

( * ) Notice: Subject to any disclaimer, the term of this patent is extended or adjusted under 35 U.S.C. 154(b) by 65 days.

(21) Appl. No.: 11/471,532

(22) Filed: Jun. 21, 2006

(65) Prior Publication Data
US 2006/0292826 A1    Dec. 28, 2006

(30) Foreign Application Priority Data
Jun. 27, 2005   (JP)  ............................. 2005-185974

(51) Int. Cl.
*H01L 21/46* (2006.01)
(52) U.S. Cl. ...................... 438/459; 438/940; 438/959; 438/977
(58) Field of Classification Search ................. 438/637, 438/977, 940, 959, 455–459, 464, 716
See application file for complete search history.

(56) References Cited

U.S. PATENT DOCUMENTS 6,951,811 B2 * 10/2005 Sorimachi ................... 438/637
7,135,385 B1 * 11/2006 Patwardhan et al. ........ 438/464
7,244,663 B2 * 7/2007 Kirby ......................... 438/459

FOREIGN PATENT DOCUMENTS

JP    2003-163323    6/2003

* cited by examiner

Primary Examiner—Ha Tran T Nguyen
Assistant Examiner—Daniel Whalen
(74) Attorney, Agent, or Firm—Smith, Gambrell & Russell, LLP

(57) ABSTRACT

A method of processing a wafer having a device area where a plurality of devices are formed on the front surface and an extra area surrounding the device area and comprising electrodes which are formed in the device area, comprising: a reinforcement forming step for removing an area, which corresponds to the device area, in the back surface of the wafer to reduce the thickness of the device area to a predetermined value and keeping an area, which corresponds to the extra area, in the back surface of the wafer to form an annular reinforcement; and a via-hole forming step for forming a via-hole in the electrodes of the wafer which has been subjected to the reinforcement forming step.

3 Claims, 8 Drawing Sheets

(a)

(b)

(a)

(b)

(a)

(b)

US 7,625,810 B2

WAFER PROCESSING METHOD

FIELD OF THE INVENTION

The present invention relates to a method of processing a wafer having a plurality of devices formed on the front surface thereof and, more specifically, to a method of processing a wafer to form via-holes at positions where electrodes of a plurality of devices are formed.

DESCRIPTION OF THE PRIOR ART

In the manufacturing process of a semiconductor device, a plurality of areas are sectioned by dividing lines called "streets" arranged in a lattice pattern on the front surface of a substantially disk-like semiconductor wafer, and a device such as IC or LSI is formed in each of the sectioned areas. Individual semiconductor chips are manufactured by grinding the back surface of this semiconductor wafer to form a determined thickness and then, cutting the semiconductor wafer along the dividing lines to divide it into the areas each having a device formed thereon.

To reduce the size and increase the number of functions of an apparatus, a module structure for connecting the electrodes of a plurality of semiconductor chips which are stacked up in layers has been implemented and disclosed by JP-A 2003-163323. This module structure is a structure in which a through-hole (via-hole) having a diameter of 30 to 500 μm at positions where electrodes are formed in the semiconductor chips, is formed and electrodes made of a conductive material such as copper to be connected to the electrodes are buried in the via-holes.

Since the thickness of the wafer before its back surface is ground to a predetermined thickness is about 700 μm, however, it is very difficult to form via-holes having a diameter of 30 to 500 μm.

Further, when via-holes are perforated after the back surface of the wafer is ground to a predetermined thickness (for example, 30 to 50 μm), they can be perforated relatively easily but the wafer is easily broken because of its thin thickness and is difficult to handle during conveyance because it curves.

Meanwhile, there has been also attempted a method of exposing the electrode buried in the back surface of the wafer by grinding the back surface of the wafer to a predetermined final thickness after via-holes having a depth corresponding to the final thickness of a device are perforated from the side of the front surface of the wafer before the back surface is ground to a predetermined thickness and an electrode made of a conductive material such as copper is buried in these via-holes. However, when the electrode is exposed by grinding the back surface of the wafer, problems arise that the electrode may stretch like whiskers due to its ductility to cause a short-circuit with an adjacent electrode, or a copper ion may enter the inside from the back surface of the wafer to reduce the quality of a device.

SUMMARY OF THE INVENTION

It is an object of the present invention to provide a wafer processing method capable of forming through-holes (via-holes) easily without causing any trouble in the handling of a wafer during its conveyance.

To attain the above object, according to the present invention, there is provided a method of processing a wafer having a device area where a plurality of devices are formed on the front surface and an extra area surrounding the device area and comprising electrodes which are formed in the device area, comprising:

a reinforcement forming step for removing an area, which corresponds to the device area, in the back surface of the wafer to reduce the thickness of the device area to a predetermined value and keeping an area, which corresponds to the extra area, in the back surface of the wafer to form an annular reinforcement; and a via-hole forming step for forming a via-hole in the electrodes of the wafer which has been subjected to the reinforcement forming step.

The above reinforcement forming step is to form a circular recess by grinding the area, which corresponds to the device area, in the back surface of the wafer. The via-hole forming step is to form a via-hole by applying a laser beam to the electrodes of the wafer.

According to the present invention, since the recess is formed by removing an area, which corresponds to the device area, in the back surface of the wafer and the thickness of the device area is reduced to a predetermined value by carrying out the reinforcement forming step, a via-hole can be easily formed in the electrodes of the wafer in the via-hole forming step. Further, since an area corresponding to the extra area is kept in the wafer which has been subjected to the reinforcement forming step to form an annular reinforcement so as to maintain its stiffness, it is not broken during conveyance and in the subsequent steps such as a step of forming an insulating film in the via-holes, a step of burying an electrode in the via-holes, a testing step and a dicing step.

DETAILED DESCRIPTION OF THE PREFERRED EMBODIMENTS

Preferred embodiments of the present invention will be described in more detail hereinunder with reference to the accompanying drawings.

Figure 1:
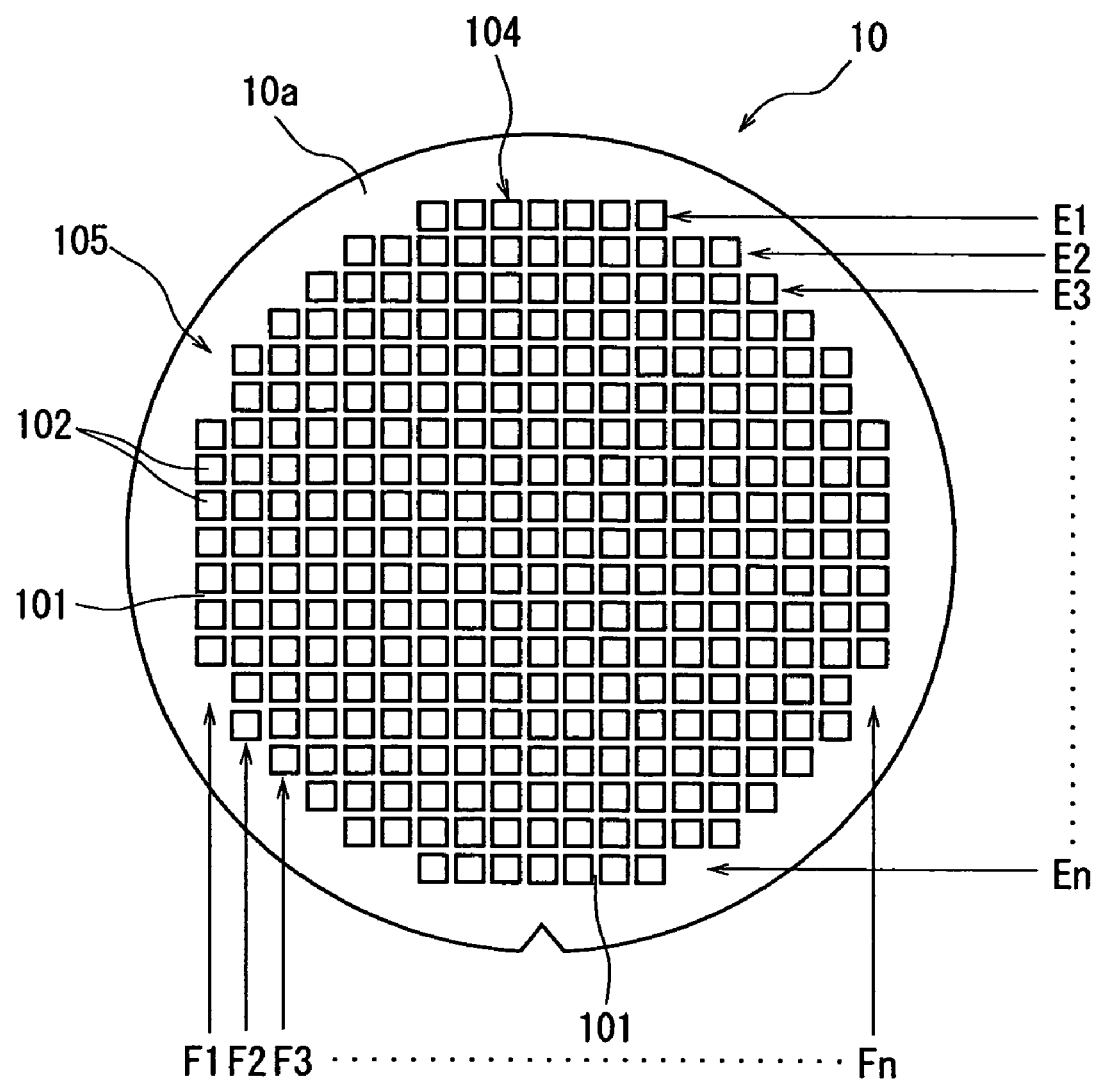
FIG. 1 is a plan view of a semiconductor wafer to be processed by the wafer processing method of the present invention.
Figure 2:
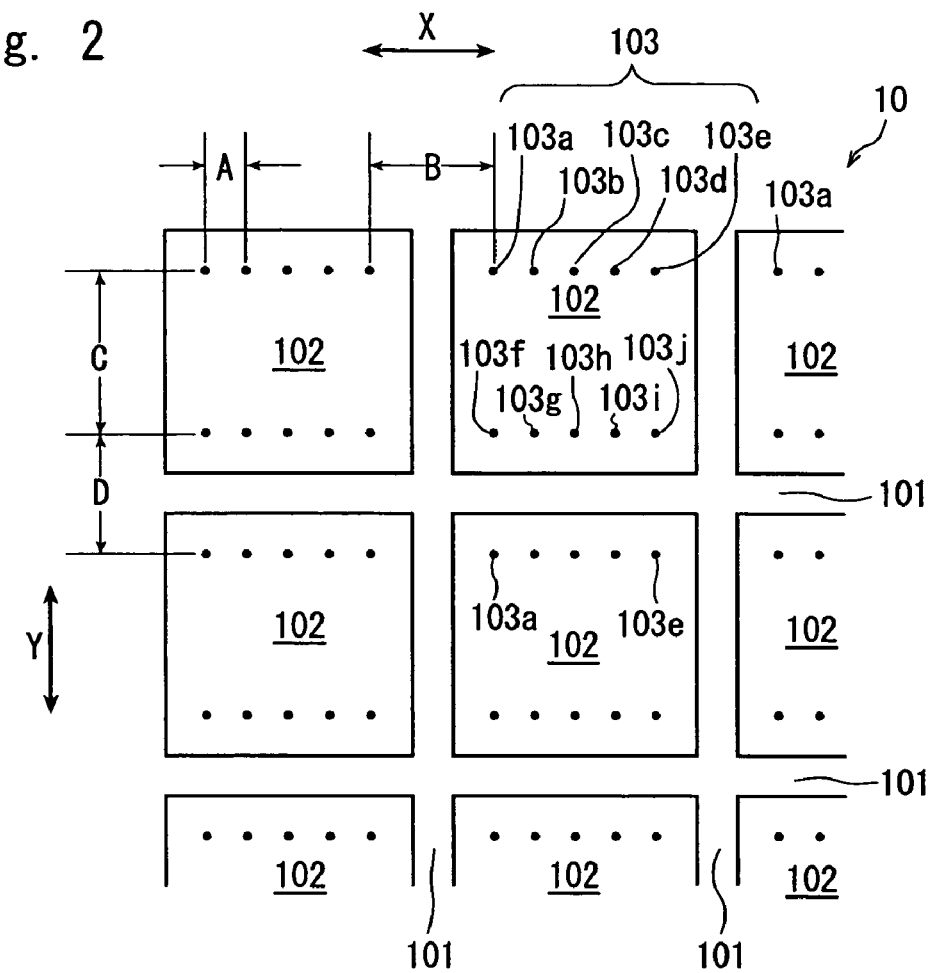
FIG. 2 is an enlarged plan view of part of the semiconductor wafer shown in FIG. 1.

FIG. 1 is a plan view of a semiconductor wafer as a wafer to be processed according to the present invention. The semiconductor wafer 10 shown in FIG. 1 is, for example, a silicon wafer having a thickness of 700 µm, a plurality of streets 101 are formed on the front surface 10a, and a device 102 such as IC or LSI is formed in a plurality of areas sectioned by the plurality of streets 101. These devices 102 are the same in constitution. A plurality of electrodes 103 (103a to 103j) are formed on the surface of each device 102, as shown in FIG. 2. In the illustrated embodiment, electrodes 103a and 103f, electrodes 103b and 103g, electrodes 103c and 103h, electrodes 103d and 103i, and electrodes 103e and 103j are at the same positions in the X direction. A via-hole is formed in each of the plurality of electrodes 103 (103a to 103j). The intervals A in the X direction (horizontal direction in FIG. 2) between adjacent electrodes 103 (103a to 103j) and the intervals B between adjacent electrodes in the X direction (horizontal direction in FIG. 2) with the street 101 interposed therebetween, that is, between the electrodes 103e and 103a out of the electrodes 103 formed on each of the devices 102 are set to be at the same interval in the illustrated embodiment. The intervals C in the Y direction (vertical direction in FIG. 2) between adjacent electrodes 103 (103a to 103j) and the intervals D between adjacent electrodes in the Y direction (vertical direction in FIG. 2) with the street 101 interposed therebetween, that is, between the electrodes 103f and 103a and between the electrodes 103j and 103e out of the electrodes 103 (103a to 103j) formed on each of the devices 102 are set to be at the same interval in the illustrated embodiment. The semiconductor device 10 constituted as described above has a device area 104 where the devices 102 are formed and an extra area 105 surrounding the device area 104.

Figure 3:
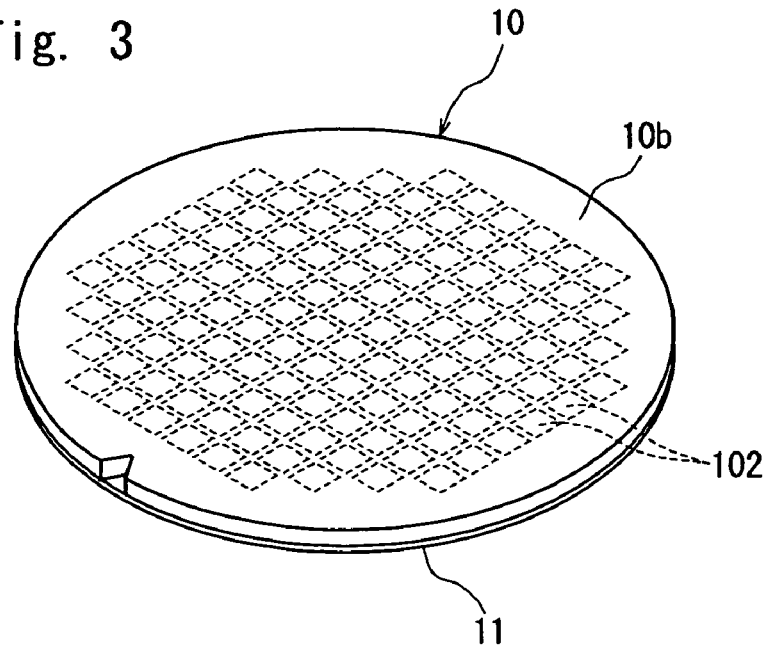
FIG. 3 is a perspective view showing a state where a protective member is affixed onto the front surface of the semiconductor wafer shown in FIG. 1.

A protective member 11 is affixed to the front surface 10a of the semiconductor wafer 10 constituted as described above as shown in FIG. 3 (protective member affixing step). Therefore, the back surface 10b of the semiconductor wafer 10 is exposed.

Figure 4:
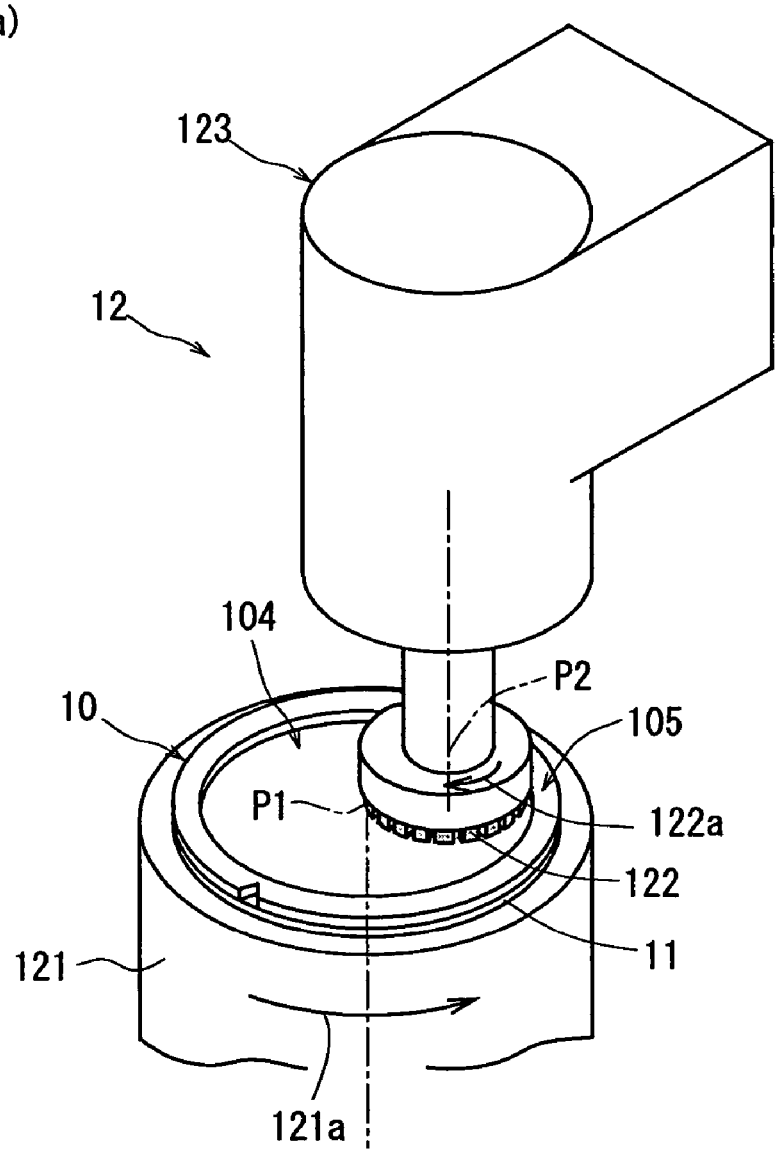
FIGS. 4(a) and 4(b) are explanatory diagrams showing a reinforcement forming step in the wafer processing method of the present invention.
Figure 4:
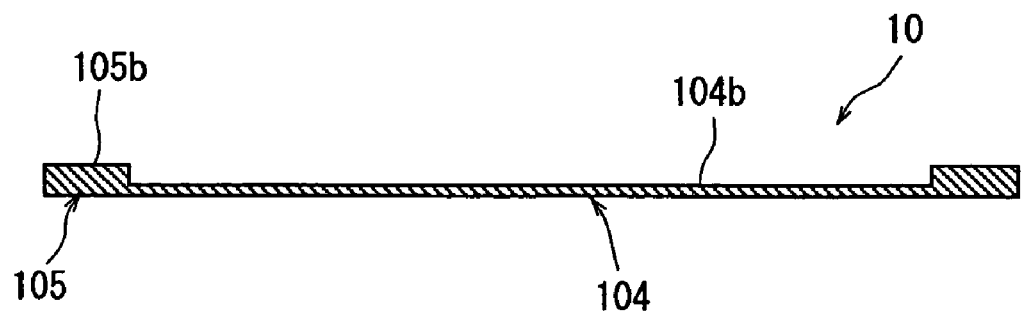

After the protective member affixing step, next comes a reinforcement forming step for forming an annular reinforcement by removing an area, which corresponds to the device area 104, in the back surface 10b of the semiconductor wafer 10 to reduce the thickness of the device area 104 to a predetermined value (final thickness of each device) and keeping an area, which corresponds to the extra area 105, in the back surface 10b of the semiconductor wafer 10. This reinforcement forming step is carried out by using a grinding machine 12 shown in FIG. 4(a) in the illustrated embodiment. The grinding machine 12 shown in FIG. 4(a) comprises a chuck table 121 for holding a workpiece, and a grinding means 123 having a grindstone 122 for grinding the workpiece held on the chuck table 121. To carry out the reinforcement forming step by using this grinding machine 12, the protective member 11 of the semiconductor wafer 10 is first placed on the chuck table 121 and suction-held on the chuck table 121. The relationship between the semiconductor wafer 10 held on the chuck table 121 and the grindstone 122 will be explained hereinbelow. The center P1 of rotation of the chuck table 121 and the center P2 of rotation of the grindstone 122 are eccentric to each other, and the diameter of the grindstone 122 is set such that the grindstone 122 is always located on the inner side of the extra area 105 of the semiconductor wafer 10 and passes over the center P1 (the center of the semiconductor wafer 10) of rotation of the chuck table 121. After the semiconductor wafer 10 is suction-held on the chuck table 121, the grindstone 122 of the grinding means 123 is rotated at 6,000 rpm in the direction indicated by an arrow 122a and brought into contact with the back surface 10b of the semiconductor wafer 10 while the chuck table 121 is rotated at 300 rpm in the direction indicated by an arrow 121a. The grinding means 123 is moved down by a predetermined distance at a predetermined grinding-feed rate. As a result, an area corresponding to the device area 104 is ground as shown in FIG. 4(b) to form a circular recess 104b having a predetermined thickness (for example, 30 µm) in the back surface 10b of the semiconductor wafer 10 and an area corresponding to the extra area 105 is kept as an annular reinforcement 105b.

Figure 5:
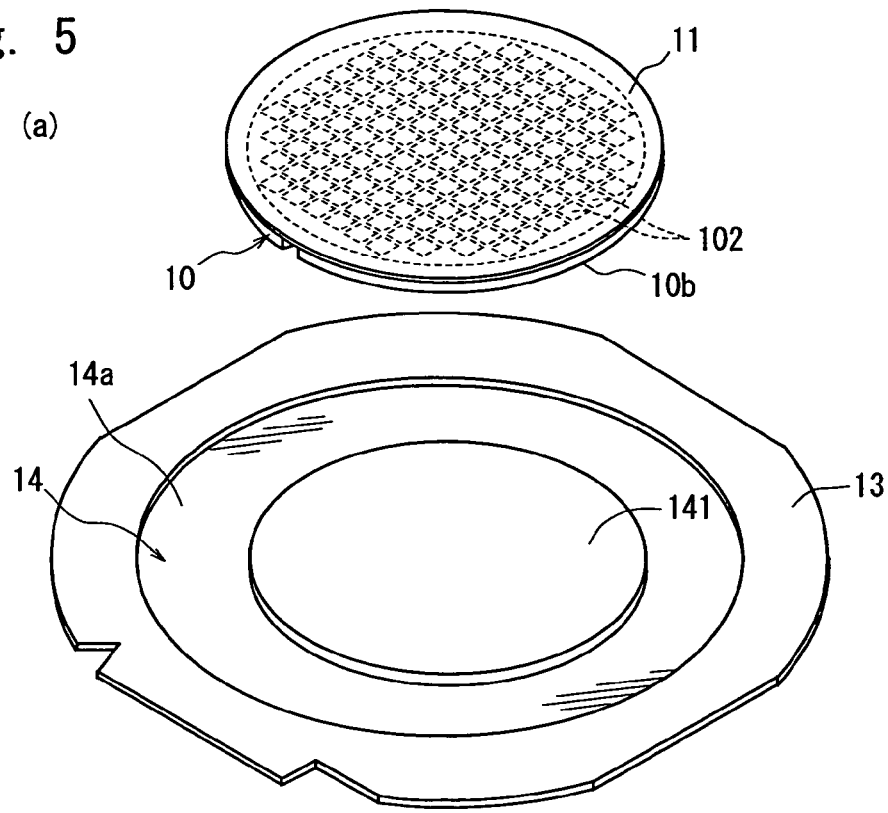
FIGS. 5(a) and 5(b) are explanatory diagrams showing the step of putting the semiconductor wafer subjected to the reinforcement forming step shown in FIGS. 4(a) and 4(b) on a support tape mounted on an annular frame.
Figure 5:
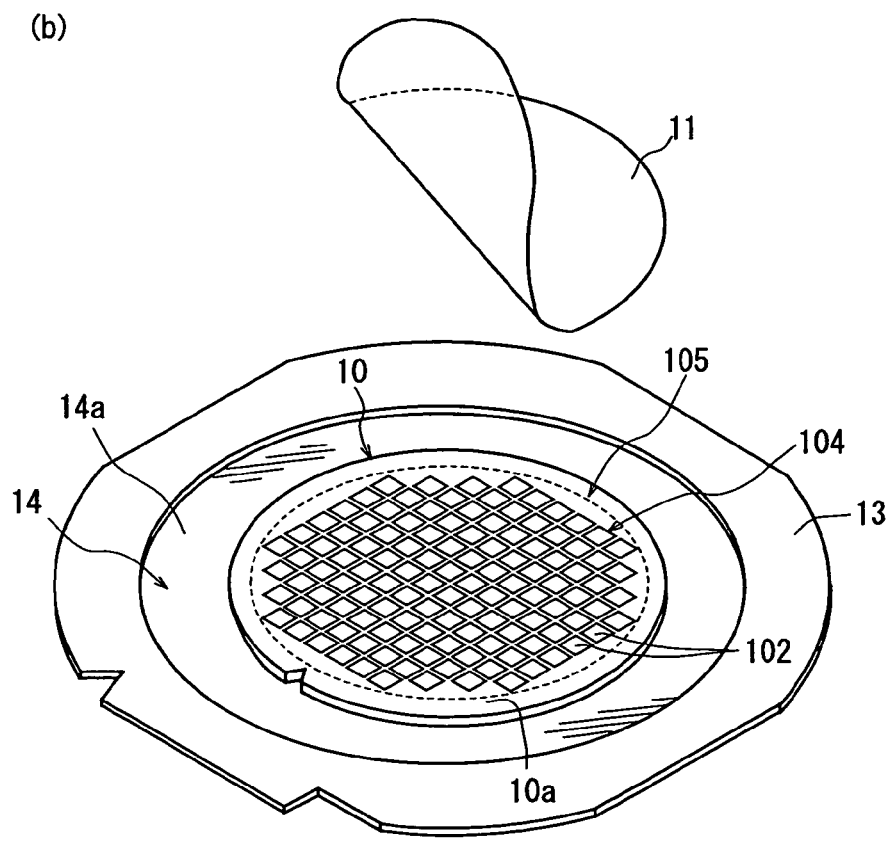

Next comes the step of putting the semiconductor wafer 10, which has been subjected to the above reinforcement forming step, on a support tape mounted on an annular frame. As shown in FIG. 5(a), a circular, device area-support portion 141 having a size and a thickness corresponding to the circular recess 104b formed in the back surface 10b of the semiconductor wafer 10 is provided on the front surface 14a of the support tape 14 composed of a synthetic resin sheet made of a polyolefin, whose peripheral portion is mounted onto the annular frame 13 so as to cover its inner opening, as shown in FIG. 5(a). At this point, the recess 104b (see FIG. 4(b)) formed in the back surface 10b of the semiconductor wafer 10 is fitted to the device area-support portion 141 provided on the front surface 14a of the support tape 14. Therefore, as shown in FIG. 5(b), the front surface 10a of the semiconductor wafer 10 affixed to the front surface 14a of the support tape 14 faces up. Then, the protective member 11 is removed.

The support tape affixing step shown in FIGS. 5(a) and 5(b) is followed by the step of forming a via-hole in the electrodes 103 (103a to 103j) of the semiconductor wafer 10. This via-hole forming step is carried out by using a laser beam processing machine shown in FIG. 6.

Figure 6:
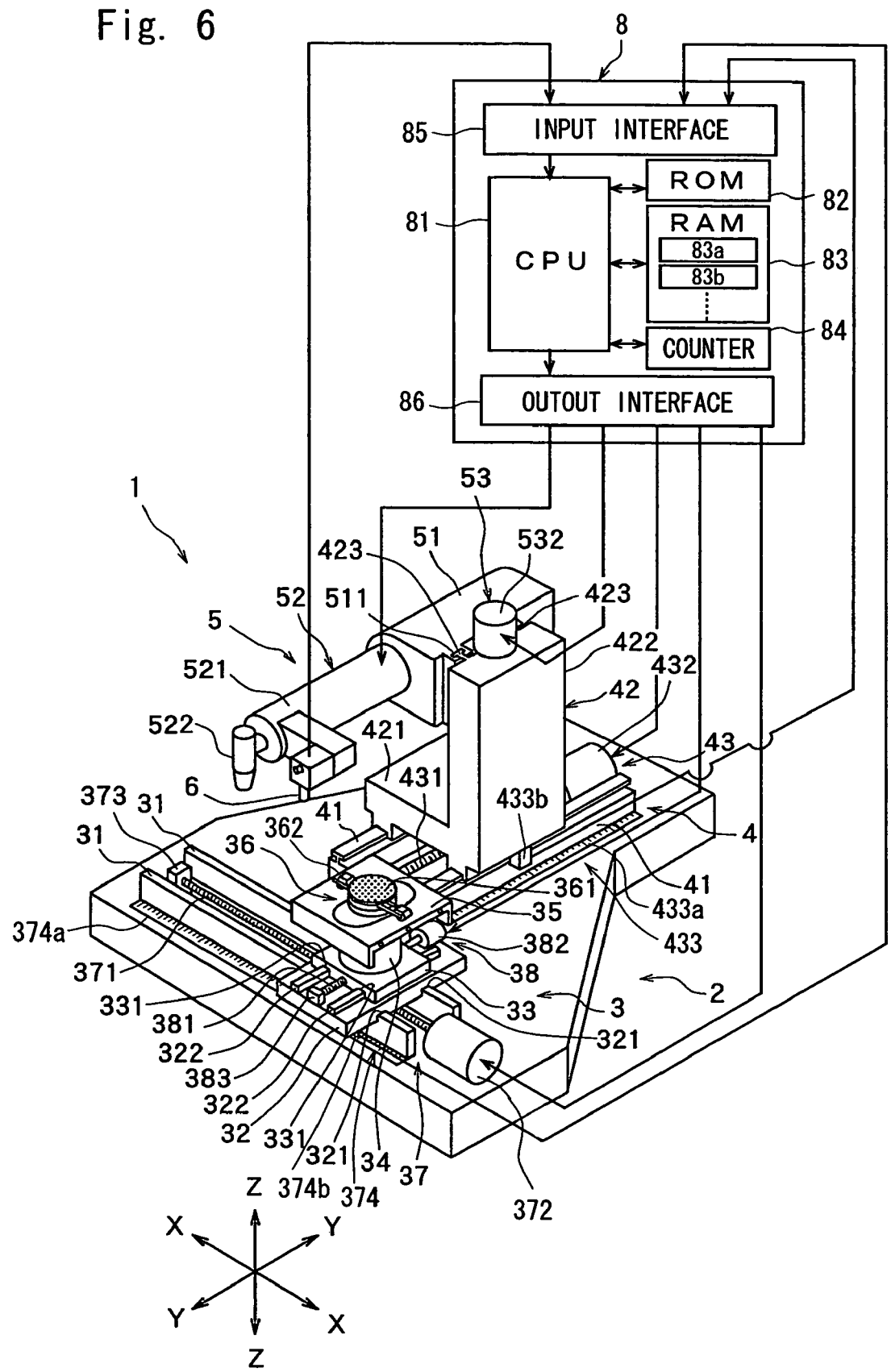
FIG. 6 is a perspective view of a laser beam processing machine for carrying out the via-hole forming step in the wafer processing method of the present invention.

The laser beam processing machine 1 shown in FIG. 6 comprises a stationary base 2, a chuck table mechanism 3 for holding a workpiece, which is mounted on the stationary base 2 in such a manner that it can move in a processing-feed direction indicated by an arrow X, a laser beam application unit support mechanism 4 mounted on the stationary base 2 in such a manner that it can move in an indexing-feed direction indicated by an arrow Y perpendicular to the above direction, and a laser beam application unit 5 mounted on the laser beam application unit support mechanism 4 in such a manner that it can move in a direction indicated by an arrow Z.

The above chuck table mechanism 3 comprises a pair of guide rails 31 and 31, which are mounted on the stationary base 2 and arranged parallel to each other in the processing-feed direction indicated by the arrow X, a first sliding block 32 that is mounted on the guide rails 31 and 31 in such a manner that it can move in the processing-feed direction indicated by the arrow X, a second sliding block 33 mounted on the first sliding block 32 in such a manner that it can move in the indexing-feed direction indicated by the arrow Y, a support table 35 supported on the second sliding block 33 by a cylindrical member 34, and a chuck table 36 as a workpiece holding means. This chuck table 36 comprises an adsorption chuck 361 made of a porous material, and a workpiece, for example, a disk-like semiconductor wafer is held on the adsorption chuck 361 by a suction means that is not shown. The chuck table 36 constituted as described above is rotated by a pulse motor (not shown) installed in the cylindrical member 34. The chuck table 36 is provided with clamps 362 for fixing an annular frame, which will be described later.

The above first sliding block 32 has, on its undersurface, a pair of to-be-guided grooves 321 and 321 to be fitted to the above pair of guide rails 31 and 31 and, on its top surface, a pair of guide rails 322 and 322 formed parallel to each other in the indexing-feed direction indicated by the arrow Y. The first sliding block 32 constituted as described above can move along the pair of guide rails 31 and 31 in the processing-feed direction indicated by the arrow X by fitting the to-be-guided grooves 321 and 321 to the pair of guide rails 31 and 31, respectively. The chuck table mechanism 3 in the illustrated embodiment comprises a processing-feed means 37 for moving the first sliding block 32 along the pair of guide rails 31 and 31 in the processing-feed direction indicated by the arrow X. The processing-feed means 37 has a male screw rod 371 arranged between the above pair of guide rails 31 and 31 parallel thereto, and a drive source such as a pulse motor 372 for rotary-driving the male screw rod 371. The male screw rod 371 is, at its one end, rotatably supported to a bearing block 373 fixed on the above stationary base 2 and is, at the other end, transmission-coupled to the output shaft of the above pulse motor 372. The male screw rod 371 is screwed into a threaded through-hole formed in a female screw block (not shown) projecting from the undersurface of the center portion of the first sliding block 32. Therefore, by driving the male screw rod 371 in a normal direction or reverse direction with the pulse motor 372, the first sliding block 32 is moved along the guide rails 31 and 31 in the processing-feed direction indicated by the arrow X.

The laser beam processing machine in the illustrated embodiment comprises a processing-feed amount detection means 374 for detecting the processing-feed amount of the above chuck table 36. The processing-feed amount detection means 374 comprises a linear scale 374a arranged along the guide rail 31 and a read head 374b which is mounted on the first sliding block 32 and moves along the linear scale 374a together with the first sliding block 32. The read head 374b of this processing-feed amount detection means 374 supplies one pulse signal for every 0.1 μm to a control means that will be described later in the illustrated embodiment. The control means counts the input pulse signals to detect the processing-feed amount of the chuck table 36. When the pulse motor 372 is used as a drive source for the above processing-feed means 37, the processing-feed amount of the chuck table 36 can be detected by counting the drive pulses of the control means for outputting a drive signal to the pulse motor 372. When a servo motor is used as a drive source for the above processing-feed means 37, a pulse signal outputted from a rotary encoder for detecting the revolution of the servo motor is supplied to the later-described control means which in turn counts the input pulse signals to detect the processing-feed amount of the chuck table 36.

The above second sliding block 33 has, on its undersurface a pair of to-be-guided grooves 331 and 331 to be fitted to the pair of guide rails 322 and 322 formed on the top surface of the above first sliding block 32 and can move in the indexing-feed direction indicated by the arrow Y by fitting the to-be-guided grooves 331 and 331 to the pair of guide rails 322 and 322, respectively. The chuck table mechanism 3 in the illustrated embodiment has a first indexing means 38 for moving the second sliding block 33 in the indexing-feed direction indicated by the arrow Y along the pair of guide rails 322 and 322 formed on the first sliding block 32. The first indexing means 38 comprises a male screw rod 381, which is arranged between the above pair of guide rails 322 and 322 parallel thereto, and a drive source such as a pulse motor 382 for rotary-driving the male screw rod 381. The male screw rod 381 is, at its one end, rotatably supported to a bearing block 383 fixed on the top surface of the above first sliding block 32 and is, at the other end, transmission-coupled to the output shaft of the above pulse motor 382. The male screw rod 381 is screwed into a threaded through-hole formed in a female screw block (not shown) projecting from the undersurface of the center portion of the second sliding block 33. Therefore, by driving the male screw rod 381 in a normal direction or reverse direction with the pulse motor 382, the second sliding block 33 is moved along the guide rails 322 and 322 in the indexing-feed direction indicated by the arrow Y.

The above laser beam application unit support mechanism 4 comprises a pair of guide rails 41 and 41, which are mounted on the stationary base 2 and arranged parallel to each other in the indexing-feed direction indicated by the arrow Y and a movable support base 42 mounted on the guide rails 41 and 41 in such a manner that it can move in the direction indicated by the arrow Y. This movable support base 42 is composed of a movable support portion 421 movably mounted on the guide rails 41 and 41 and a mounting portion 422 mounted on the movable support portion 421. The mounting portion 422 is provided with a pair of guide rails 423 and 423 extending parallel to each other in the direction indicated by the arrow Z on one of its flanks. The laser beam application unit support mechanism 4 in the illustrated embodiment comprises a second indexing-feed means 43 for moving the movable support base 42 along the pair of guide rails 41 and 41 in the indexing-feed direction indicated by the arrow Y. This second indexing-feed means 43 comprises a male screw rod 431 arranged between the above pair of guide rails 41 and 41 parallel thereto, and a drive source such as a pulse motor 432 for rotary-driving the male screw rod 431. The male screw rod 431 is, at its one end, rotatably supported to a bearing block (not shown) fixed on the above stationary base 2 and is, at the other end, transmission-coupled to the output shaft of the above pulse motor 432. The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or reverse direction with the pulse motor 432, the movable support base 42 is moved along the guide rails 41 and 41 in the indexing-feed direction indicated by the arrow Y.

The laser beam processing machine in the illustrated embodiment comprises an indexing-feed amount detection means 433 for detecting the indexing-feed amount of the movable support base 42 of the above laser beam application unit support mechanism 4. This indexing-feed amount detection means 433 is composed of a linear scale 433a arranged along the guide rail 41 and a read head 433b which is mounted on the movable support base 42 and moves along the linear scale 433a. The read head 433b of the indexing-feed amount detection means 433 supplies one pulse signal for every 1 μm to the later-described control means in the illustrated embodiment. The later-described control means counts the input pulse signals to detect the indexing-feed amount of the laser beam application unit 5. When the pulse motor 432 is used as a drive source for the above second indexing-feed means 43, the indexing-feed amount of the laser beam application unit 5 can be detected by counting the drive pulses of the later-described control means for outputting a drive signal to the pulse motor 432. When a servo motor is used as a drive source for the above second indexing-feed means 43, a pulse signal outputted from a rotary encoder for detecting the revolution of the servo motor is supplied to the later-described control means, which in turn counts the input pulse signals to detect the indexing-feed amount of the laser beam application unit 5.

The laser beam application unit 5 in the illustrated embodiment comprises a unit holder 51 and a laser beam application means 52 secured to the unit holder 51. The unit holder 51 has a pair of to-be-guided grooves 511 and 511 to be slidably fitted to the pair of guide rails 423 and 423 formed on the above mounting portion 422 and is supported in such a manner that it can move in the direction indicated by the arrow Z by fitting the guide grooves 511 and 511 to the above guide rails 423 and 423, respectively.

The illustrated laser beam application means 52 applies a pulse laser beam from a condenser 522 mounted on the end of a cylindrical casing 521 arranged substantially horizontally. An image pick-up means 6 for detecting the area to be processed by the above laser beam application means 52 is mounted onto the front end portion of the casing 521 constituting the above laser beam application means 52. This image pick-up means 6 comprises an illuminating means for illuminating the workpiece, an optical system for capturing the area illuminated by the illuminating means, and an image pick-up device (CCD) for picking up an image captured by the optical system. An image signal is supplied to the control means later described.

The laser beam application unit 5 in the illustrated embodiment comprises a moving means 53 for moving the unit holder 51 along the pair of guide rails 423 and 423 in the direction indicated by the arrow Z. The moving means 53 comprises a male screw rod (not shown) arranged between the pair of guide rails 423 and 423 and a drive source such as a pulse motor 532 for rotary-driving the male screw rod. By driving the male screw rod (not shown) in a normal direction or reverse direction with the pulse motor 532, the unit holder 51 and the laser beam application means 52 are moved along the guide rails 423 and 423 in the direction indicated by the arrow Z. In the illustrated embodiment, the laser beam application means 52 is moved up by driving the pulse motor 532 in a normal direction and moved down by driving the pulse motor 532 in the reverse direction.

The laser beam processing machine in the illustrated embodiment comprises a control means 8. The control means 8 is constituted by a computer which comprises a central processing unit (CPU) 81 for carrying out arithmetic processing based on a control program, a read-only memory (ROM) 82 for storing the control program, etc., a read/write random access memory (RAM) 83 for storing data on the design values of the workpiece and the results of operations both of which will be described later, a counter 84, an input interface 85 and an output interface 86. Detection signals from the above processing-feed amount detection means 374, the indexing-feed amount detection means 433, the image pick-up means 6, etc. are supplied to the input interface 84 of the control means 8. Control signals are output from the output interface 86 of the control means 8 to the pulse motor 372, the pulse motor 382, the pulse motor 432, the pulse motor 532 and the laser beam application means 52, etc. The above random access memory (RAM) 83 has a first storage area 83a for storing data on the later described design values of the workpiece, a second storage area 83b for storing data on the later-described detection values, and other storage area.

A description will be subsequently given of the step of forming via-holes in the electrodes 103 (103a to 103j) of the devices 102 formed on the above semiconductor wafer 10 by using the above-described laser beam processing machine 1.

The design value data of the above-described semiconductor wafer 10, which include the numbers of devices 102 arranged in rows E1 to En and columns F1 to Fn shown in FIG. 1 and the above intervals A, B, C and D shown in FIG. 2 are stored in the first storage area 83a of the above random access memory (RAM) 83 of the control means 8.

The semiconductor wafer 10 supported to the annular frame 13 through the support tape 14 as shown in FIGS. 5(a) and 5(b) is placed on the chuck table 36 of the laser beam processing machine 1 shown in FIG. 6 in such a manner that the support tape 14 comes into contact with the chuck table 36. The semiconductor wafer 10 is suction-held on the chuck table 36 through the support tape 14 by activating the suction means that is not shown. The annular frame 13 is fixed by the clamps 362.

The chuck table 36 suction-holding the semiconductor wafer 10 as described above is brought to a position right below the image pick-up means 6 by the processing-feed means 37. After the chuck table 36 is positioned right below the image pick-up means 6, the semiconductor wafer 10 on the chuck table 36 becomes a state where it is located at a coordinate position shown in FIG. 7. In this state, alignment work is carried out to check whether the streets 101 formed in a lattice pattern on the semiconductor wafer 10 held on the chuck table 36 are parallel to the X direction and the Y direction or not. That is, an image of the semiconductor wafer 10 held on the chuck table 36 is picked up by the image pick-up means 6 to carry out image processing such as pattern matching, etc. for the alignment work.

Thereafter, the chuck table 36 is moved to bring a device 102 at the most left end in FIG. 7 in the top row E1 out of the devices 102 formed on the semiconductor wafer 10 to a position right below the image pick-up means 6. Further, the upper left electrode 103a in FIG. 7 out of the electrodes 103 (103a to 103j) formed on the device 102 is brought to a position right below the image pick-up means 6. After the image pick-up means 6 detects the electrode 103a in this state, its coordinate value (a1) is supplied to the control means 8 as a first processing-feed start position coordinate value. The control means 8 stores the coordinate value (a1) in the random access memory (RAM) 83 as the first processing-feed start position coordinate value (processing-feed start position detecting step). Since a predetermined space is interposed between the image pick-up means 6 and the condenser 522 of the laser beam application means 52 in the X direction at this point, a value obtained by adding the interval between the above image pick-up means 6 and the condenser 522 is stored as an X coordinate value.

Figure 7:
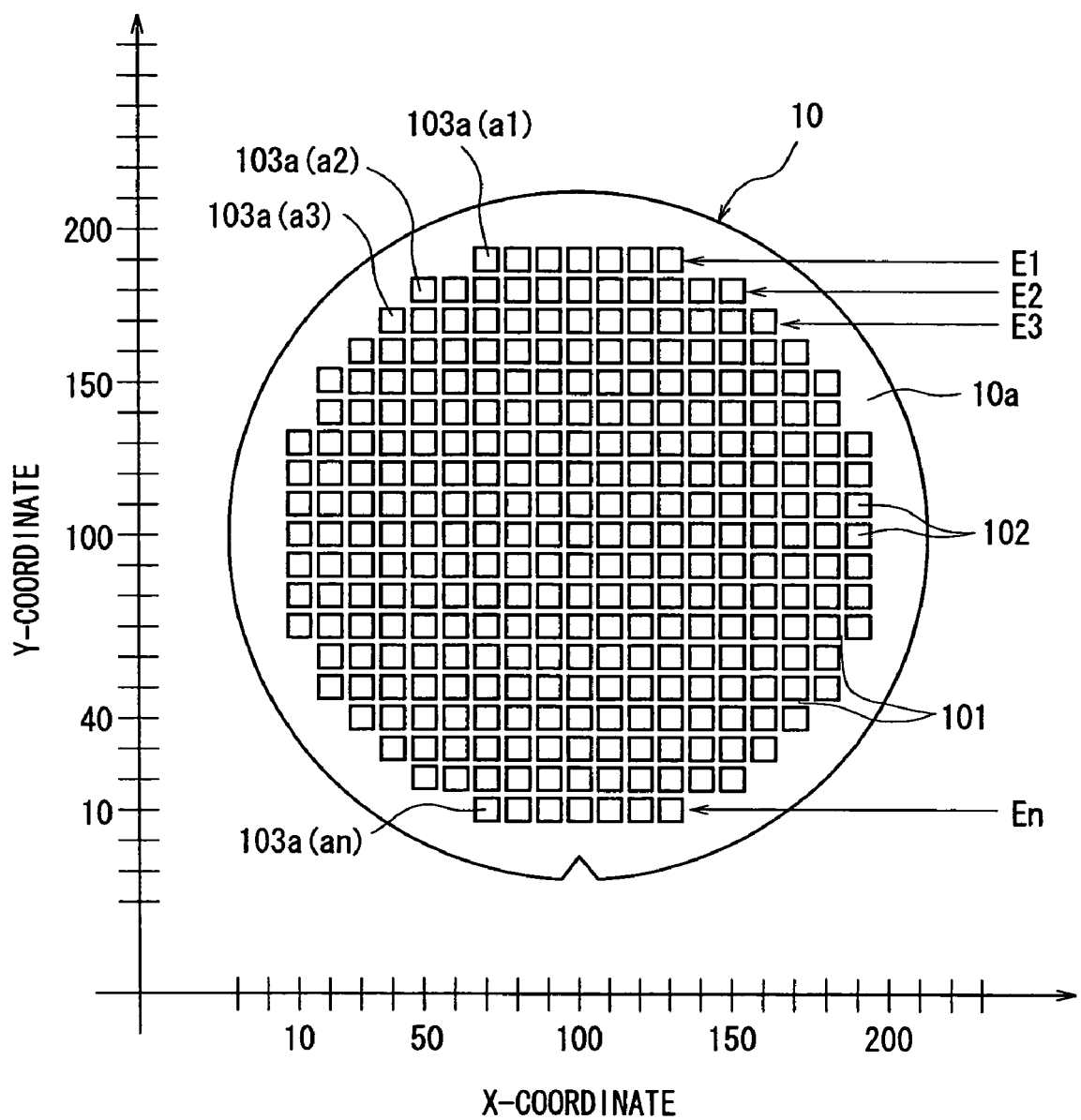
FIG. 7 is an explanatory diagram showing the relationship between the semiconductor wafer shown in FIG. 1 and its coordinates in a state where the semiconductor wafer is held at a predetermined position of the chuck table of the laser beam processing machine shown in FIG. 6.

After the first processing-feed start position coordinate values (a1) of the device 102 in the top row E1 in FIG. 7 are detected as described above, the chuck table 36 is moved by a distance corresponding to the interval between the streets 101 in the indexing-feed direction indicated by the arrow Y and moved in the processing-feed direction indicated by the arrow X to bring a device 102 at the most left end in the second row E2 from the top in FIG. 7 to a position right below the image pick-up means 6. Further, the upper left electrode 103a in FIG. 7 out of the electrodes 103 (103a to 103j) formed on the device 102 is brought to a position right below the image pick-up means 6. After the image pick-up means 6 detects the electrode 103a in this state, its coordinate value (a2) is supplied to the control means 8 as a second processing-feed start position coordinate value. The control means 8 stores the coordinate value (a2) in the second storage area 83b of the random access memory (RAM) 83 as the second processing-feed start position coordinate value. Since a predetermined space is interposed between the image pick-up means 6 and the condenser 522 of the laser beam application means 52 in the X direction at this point as described above, a value obtained by adding the interval between the image pick-up means 6 and the condenser 522 is stored as an X coordinate value. The above indexing-feed and processing-feed start position detecting steps are repeated up to the bottom row En in FIG. 7 to detect the processing-feed start position coordinate values (a3 to an) of the devices 102 formed in the rows and store them in the second storage area 83b of the random access memory (RAM) 83.

Figure 8:
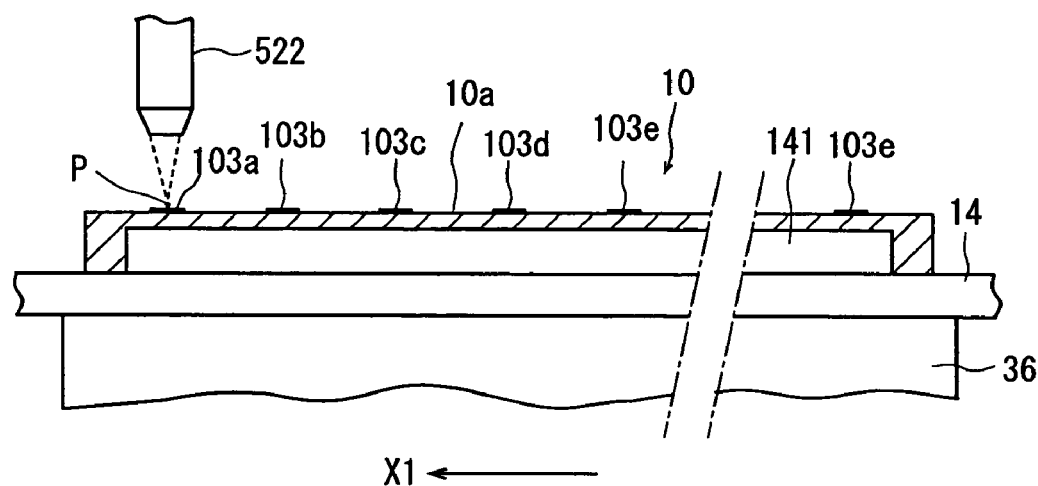
FIGS. 8(a) and 8(b) are explanatory diagrams showing the via-hole forming step carried out by the laser beam processing machine shown in FIG. 6.
Figure 8:
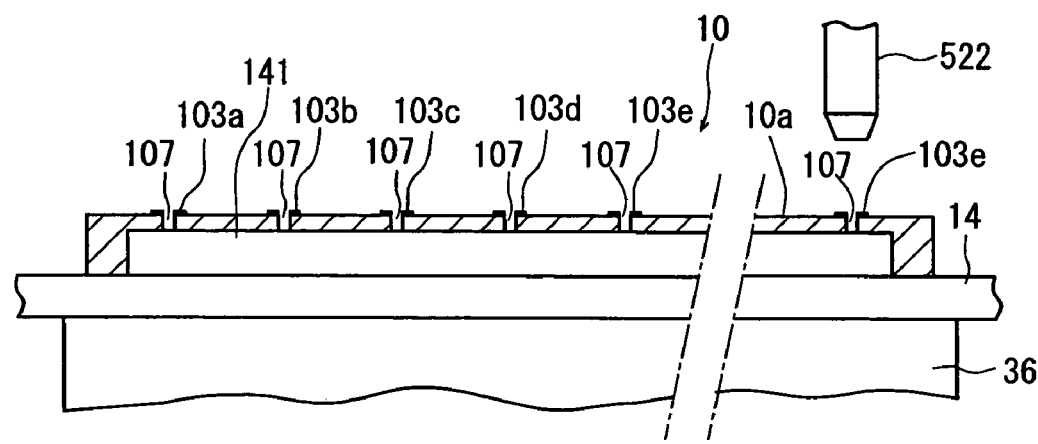

Next comes the step of forming via-holes in the electrodes 103 (103a to 103j) formed on each device 102 of the semiconductor wafer 10. In this via-hole forming step, the processing-feed means 37 is first activated to move the chuck table 36 so as to bring the point of the first processing-feed start position coordinate value (a1) stored in the second storage area 83b of the above random access memory (RAM) 83 to a position right below the condenser 522 of the laser beam application means 52. FIG. 8(a) shows that the point of the first processing-feed start position coordinate value (a1) is positioned right below the condenser 522. In the state shown in FIG. 8(a), the control means 8 activates the laser beam application means 52 to apply one pulse laser beam from the condenser 522 and controls the above processing-feed means 37 to processing-feed the chuck table 36 in the direction indicated by the arrow X1 shown in FIG. 8(a) at a predetermined moving rate. Therefore, one pulse laser beam is applied to the electrode 103a at the point of the first processing-feed start position coordinate values (a1). At this point, the focusing point P of the laser beam applied from the condenser 522 is set to a position near the front surface 10a of the semiconductor wafer 10. Meanwhile, the control means 8 receives detection signals from the read head 374b of the processing-feed amount detection means 374 and counts the detection signals by means of the counter 84. When the count value of the counter 84 reaches a value corresponding to the interval A in the X direction in FIG. 2 between the electrodes 103, the control means 8 activates the laser beam application means 52 to apply one pulse laser beam from the condenser 522. The control means 8 also activates the laser beam application means 52 to apply one pulse laser beam from the condenser 522 each time the count value of the counter 84 reaches a value corresponding to the interval A or B in the X direction in FIG. 2 between the electrodes 103. When the electrode 103e at the most right end in FIG. 1 out of the electrodes 103 formed on the device 102 at the most right end in the row E1 of the semiconductor wafer 10 reaches the condenser 522 as shown in FIG. 8(b), the control means 8 activates the laser beam application means 52 to apply one pulse laser beam from the condenser 522 and then, suspends the operation of the above processing-feed means 37 to stop the movement of the chuck table 36. As a result, via-holes 107 are formed in the electrodes 103 (not shown) of the semiconductor wafer 10, as shown in FIG. 8(b).

The processing conditions of the above via-hole forming step is set as follows, for example.

Figure 9:
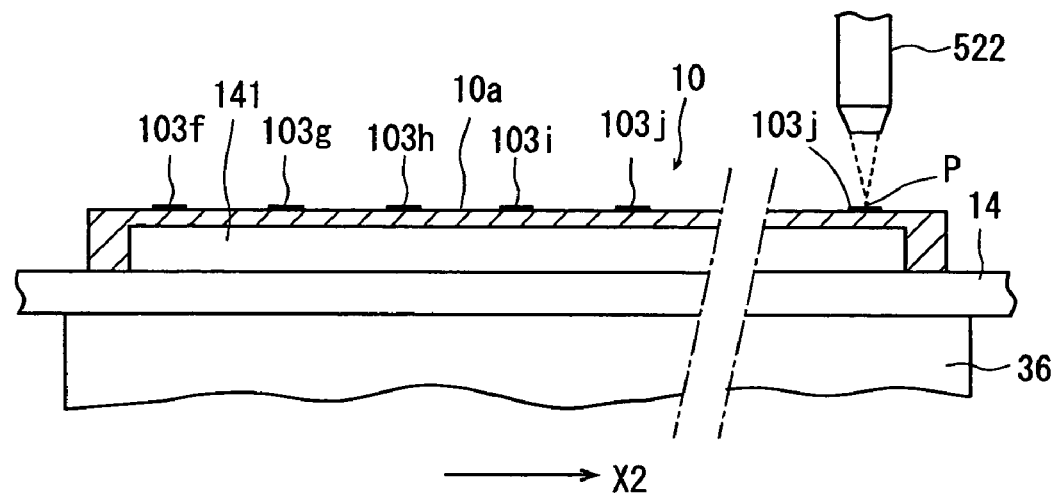
FIGS. 9(a) and 9(b) are explanatory diagrams showing the via-hole forming step carried out by the laser beam processing machine shown in FIG. 6.
Figure 9:
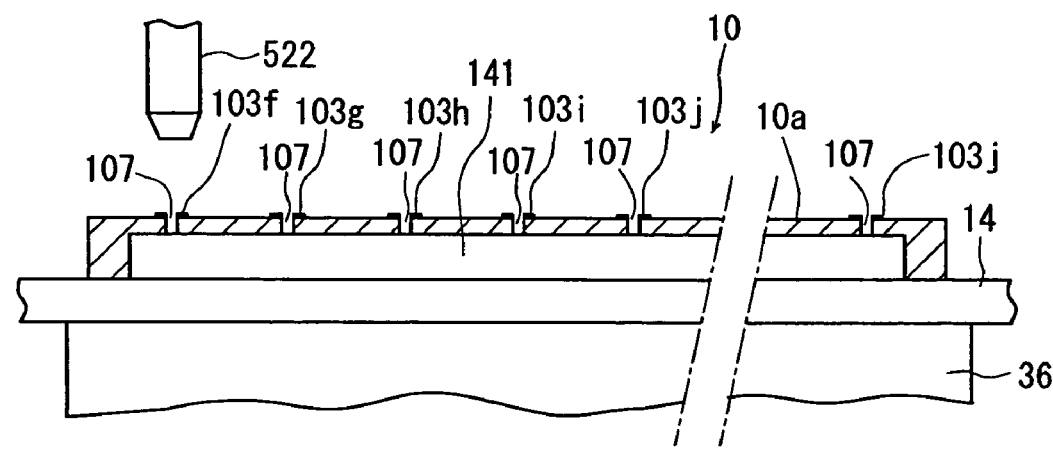

Light source: LD excited Q switch Nd: YVO4
  Wavelength: 355 nm
  Output: 6 W
  Focusing spot diameter: 50 μm
  Processing-feed rate: 100 mm/sec Thereafter, the control means 8 controls the above second indexing-feed means 43 to move the condenser 522 of the laser beam application means 52 in the indexing-feed direction perpendicular to the sheet in FIG. 8(b). Meanwhile, the control means 8 receives detection signals from the read head 433b of the indexing-feed amount detection means 433 and the detection signals are counted by the counter 84. When the count value of the counter 84 reaches a value corresponding to the interval C in the Y direction in FIG. 2 between the electrodes 103, the operation of the second indexing-feed means 43 is suspended to stop the indexing-feed of the condenser 522 of the laser beam application means 52. As a result, the condenser 522 is positioned right above the electrode 103j (see FIG. 2) opposed to the above electrode 103e. This state is shown in FIG. 9(a). In the state shown in FIG. 9(a), the control means 8 activates the laser beam application means 52 to apply one pulse laser beam from the condenser 522 and controls the above processing-feed means 37 to move the chuck table 36 in the direction indicated by the arrow X2 in FIG. 9(a) at a predetermined moving rate. Then, the control means 8 counts detection signals from the read head 374b of the processing-feed amount detection means 374 by means of the counter 84 as described above and activates the laser beam application means 52 so as to apply one pulse laser beam from the condenser 522 each time the count value of the counter 84 reaches the interval A or B in the X direction in FIG. 2 between the electrodes 103. When the electrode 103f formed on the device 102, at the most left end in the row E1 of the semiconductor wafer 10 reaches the condenser 522 as shown in FIG. 9(b), the control means 8 activates the laser beam application means 52 so as to apply one pulse laser beam from the condenser 522 and then, suspends the operation of the above processing-feed means 37 to stop the movement of the chuck table 36. As a result, via-holes 107 are formed in the electrodes 103 (not shown) of the semiconductor wafer 10 as shown in FIG. 9(b).

After the via-holes 107 are formed in the electrodes 103 on the devices 102 in the row E1 of the semiconductor wafer 10 as described above, the control means 8 activates the processing-feed means 37 and the second indexing-feed means 43 to position the point of the second processing-feed start position coordinate values (a2) stored in the second storage area 83b of the above random access memory (RAM) 83 in the electrodes 103 formed on the device 102 in the row E2 of the semiconductor wafer 10 right below the condenser 522 of the laser beam application means 52. Then, the control means 8 controls the laser beam application means 52, the processing-feed means 37 and the second indexing-feed means 43 to carry out the above via-hole forming step on the electrodes 103 formed on the devices 102 in the row E2 of the semiconductor wafer 10. Subsequently, the above via-hole forming step is also carried out on the electrodes 103 formed on the devices 102 in the rows E3 to En of the semiconductor wafer 10. As a result, via-holes 107 are formed in all the electrodes 103 on the devices 102 of the semiconductor wafer 10.

In the above illustrated embodiment, as described above, by carrying out the above reinforcement forming step, the area corresponding to the device area 104 of the back surface 10b of the semiconductor wafer 10 is removed thereby to form the recess 104b and to reduce the thickness of the device area 104 to a predetermined value (final thickness of the device). Therefore, the via-holes 107 can be easily perforated in the electrodes 103 of the semiconductor device 10 in the via-hole forming step. Further, since the area corresponding to the extra area 105 is kept in the semiconductor wafer 10 which has been subjected to the reinforcement forming step to form the annular reinforcement 105b so as to maintain stiffness, the semiconductor wafer 10 is not broken during conveyance and in the subsequent steps such as the step of forming an insulating film in the via-holes 107, the step of burying an electrode in the via-holes 107, testing step and dicing step Although the reinforcement forming step is carried out by the grinding machine in the above embodiment, the reinforcement forming step may be carried out by other means. For example, an area other than the area corresponding to the device area of the back surface of the wafer may be masked and plasma etched with a fluorine-based gas or wet etched with a fluorine-based etchant to remove the area corresponding to the device area of the back surface of the wafer so as to reduce the thickness of the device area to a predetermined value, and the area corresponding to the extra area of the back surface of the wafer may be kept to form an annular reinforcement. The area corresponding to the device area of the back surface of the wafer may be removed by chemical mechanical polishing (CMP) to reduce the thickness of the device area to a predetermined value, and the area corresponding to the extra area of the back surface of the wafer may be kept to form the annular reinforcement.

In the above embodiment, the above via-hole forming step is to form via-holes by using the laser beam processing machine. However, the via-hole forming step may be carried out by using an electroforming drill having a diameter of 100 to 500 µm to form via-holes.

What is claimed is:

1. A method of processing a wafer having a device area where a plurality of devices are present on the front surface and an extra area surrounding the device area and comprising electrodes which are present in the device area, said method comprising:

a reinforcement forming step for removing an area, which corresponds to the device area and which is in the back surface of the wafer, to reduce the thickness of the device area to a predetermined value by grinding the area to form a circular recess thereat, and for keeping an area, which corresponds to the extra area, in the back surface of the wafer to form an annular reinforcement;

a support tape affixing step for affixing the wafer, which has been subjected to the reinforcement forming step, to a support tape mounted onto an annular frame; and a via-hole forming step for forming a via-hole in the electrodes of the wafer which has been subjected to the reinforcement forming step, wherein a device area-support portion having a form and a thickness corresponding to the circular recess of the wafer is provided on the front surface of the support tape, the circular recess of the wafer is fitted with the device area-support portion, and the via-hole forming step forms the via-hole by applying a laser beam to the electrodes of the wafer.

2. The method of processing a wafer according to claim 1, wherein the annular reinforcement in the wafer is kept in a testing step after the via-hole forming step.

3. The method of processing a wafer according to claim 1, wherein the annular reinforcement in the wafer is kept in a dicing step after the via-hole forming step.

* * * * *